United States Patent [19]
Jiang et al.

[11] Patent Number: 5,914,973
[45] Date of Patent: Jun. 22, 1999

[54] VERTICAL CAVITY SURFACE EMITTING LASER FOR HIGH POWER OPERATION AND METHOD OF FABRICATION

[75] Inventors: Wenbin Jiang, Phoenix; Michael S. Lebby, Apache Junction; Jamal Ramdani, Gilbert, all of Ariz.

[73] Assignee: Motorola, Inc., Schaumburg, Ill.

[21] Appl. No.: 08/795,260

[22] Filed: Feb. 10, 1997

[51] Int. Cl.$^6$ ........................................ H01S 3/19
[52] U.S. Cl. .................................. 372/36; 372/45; 372/96
[58] Field of Search .................................. 372/36, 96, 45

[56] References Cited

U.S. PATENT DOCUMENTS 5,724,376  3/1998  Kish, Jr. et al. ........................ 372/36

*Primary Examiner*—James W. Davie
*Attorney, Agent, or Firm*—Eugene A. Parsons; William E. Koch

[57] ABSTRACT

A VCSEL for high power operation and method of fabrication including a substrate element, a heat dissipation layer disposed on the substrate element, a first mirror stack, an active region lattice matched to a surface of the first mirror stack, and a second mirror stack lattice matched to a surface of the active region. An electrical contact is coupled to a surface of the active region and an electrical contact is positioned on another surface of the active region. The VCSEL is fabricated initially as two wafer structures each including a heat dissipation layer. The two wafer structures are flip mounted and the two heat dissipation layers are fused together to form a single heat dissipation layer. The structure is then selectively etched to remove a substrate element onto which the first wafer structure was formed.

21 Claims, 2 Drawing Sheets

VERTICAL CAVITY SURFACE EMITTING LASER FOR HIGH POWER OPERATION AND METHOD OF FABRICATION

FIELD OF THE INVENTION

This invention relates to vertical cavity surface emitting lasers and more specifically to vertical cavity surface emitting lasers for high power operation.

BACKGROUND OF THE INVENTION

Vertical cavity surface emitting lasers (VCSEL) include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an $Al_{x1}Ga_{1-x1}As\backslash Al_{x2}Ga_{1-x2}As$ material system wherein the different refractive index of each layer of a pair is achieved by altering the aluminum content x1 and x2 in the layers. In conventional devices, the number of mirror pairs per stack may range from 20–40 pairs to achieve a high percentage of reflectivity, depending on the difference between the refractive indices of the layers. The large number of pairs increases the percentage of reflected light.

In conventional VCSELs, conventional material systems perform adequately. However, new products are being developed, such as CD write devices and those utilizing infra-red data links, that require VCSELs to operate at a higher power, i.e. greater than 20 milliwatts. For example, in conventional 780 nm and 850 nm VCSELs, which utilize a GaAs substrate, the GaAs substrate is absorptive with a laser emission being toward the opposite direction, the top. Accordingly, heat is dissipated into the GaAs substrate. The GaAs substrate is not a good thermal conductor and thereby causes the heat to accumulate near the active region. This in turn causes a temperature rise which saturates the laser output power. Therefore, it becomes difficult to generate high power from this type of VCSEL, especially at ambient temperatures, i.e. 50–60° C.

Thus, there is a need for developing a reliable, stable and cost effective vertical cavity surface emitting laser (VCSEL) for use in high power operations, that includes smaller thermal resistance through the integration of a heat dissipator, thereby enabling the VCSEL to operate at high power.

It would be highly advantageous, therefore, to remedy the foregoing and other deficiencies inherent in the prior art. Accordingly, it is an object of the present invention to provide a new and improved VCSEL for use in high power operations.

Another object of the invention is to provide a reliable high power VCSEL.

And another object of the immediate invention is to provide for an efficient heat dissipator for use in a high power VCSEL.

Still another object of the invention is to provide for a smaller degree of thermal resistance in a high power VCSEL.

Yet another object of the invention is to provide for a highly manufacturable high power VCSEL.

SUMMARY OF THE INVENTION

Briefly, to achieve the desired objects of the instant invention in accordance with a preferred embodiment thereof, provided is a VCSEL for use in high power operation. The VCSEL generally includes a silicon substrate, a heat dissipation layer, a first stack of distributed Bragg reflectors, an active region, and a second stack of distributed Bragg reflectors.

In a preferred embodiment the heat dissipation layer is composed of a gold germanium (AuGe) or a gold (Au) material to efficiently dissipate heat from the active region into the silicon substrate.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
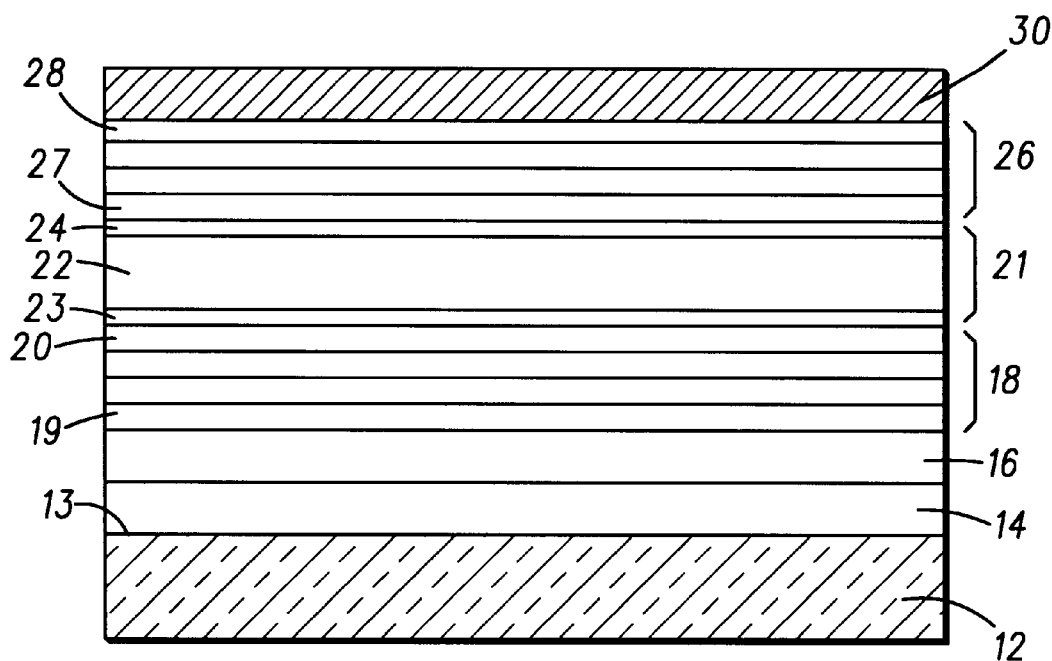
FIG. 1 is a sectional view of a first VCSEL wafer structure in accordance with the present invention.

Turning now to the drawings in which like reference characters indicate corresponding elements throughout the several views, attention is first directed to FIG. 1 which illustrates the fabrication of a first vertical cavity surface emitting laser (VCSEL) wafer structure generally designated 10. Wafer structure 10 is formed on a substrate 12, which in this specific embodiment is gallium arsenide (GaAs). GaAs is preferably used to facilitate lattice matching of the components of wafer structure 10 which emits infrared wavelength light, more particularly 780 nm or 850 nm light, dependent upon the specific material system used. Also, GaAs is utilized so as to facilitate epitaxial growth of subsequent multiple layers that compose wafer structure 10. It should be understood that GaAs is only utilized as an example and other semiconductor materials may be employed as substrate 12, such as silicon (Si), indium phosphide (InP), or the like.

Typically, any suitable epitaxial deposition method, such as molecular beam epitaxy (MBE), metal organic chemical vapor deposition (MOCVD), or the like is used to make the required multiple layers for wafer structure 10. These methods allow for the epitaxial deposition of material layers, such as aluminum gallium arsenide, aluminum arsenide, indium aluminum gallium phosphide, gallium arsenide, and aluminum arsenide, or aluminum gallium phosphide, indium aluminum phosphide, and the like. It should be understood that epitaxial deposition is used extensively to produce the multitude of layers that comprise the complete VCSEL device of the present invention.

Substrate 12 has an upper surface 13 on which a buffer layer 14 is disposed. Buffer layer 14 includes a p-doped gallium arsenide (GaAs) material. Next, an etch stop layer 16 is disposed on buffer layer 14. Etch stop layer 16 includes an aluminum gallium arsenide (AlGaAs) material or an aluminum gallium phosphide (AlGaP) material. Buffer layer 14 and etch stop layer 16 will aid in the removal of substrate 12 during the fabrication of the complete VCSEL for high power operation of the present invention.

A first mirror stack 18 is disposed on etch stop layer 16. An active region 21 is disposed on mirror stack 18. Active region 21 includes an active structure 22 sandwiched between a first cladding region 23 adjacent first mirror stack 18 and a second cladding region 24. A second mirror stack 26 is disposed on second cladding region 24.

Referring now to distributed Bragg reflectors 18 and 26, it should be understood that distributed Bragg reflector 18 is deposited first with subsequent deposition defining cladding region 23, active structure 22, cladding region 24, distributed Bragg reflector 26 and a heat dissipation layer 30. Generally, thicknesses of alternating layers 19, 20, 27, and 28 are typically set as portions of a wavelength of light (not shown) that the complete VCSEL device is designed to emit. Thus, specific thicknesses of the alternating layers 19, 20, 27 and 28 are a function of the designed wavelength at which the VCSEL is to operate. Typically, the most common wavelength values used are one-quarter, one-half, three-quarters, full wavelength, or any multiples thereof. In a preferred embodiment of the present invention, one-quarter wavelength thicknesses are used.

Generally, doping of the distributed Bragg reflectors 18 and 26 is split with one of the distributed Bragg reflectors being N-type and the other being P-type. Since doping levels are well known in the art, the doping levels will not be described herein other than to identify material either as undoped, P-typed doped such as with carbon, zinc or the like, or N-typed doped such as with selenium, silicon, or the like. Briefly, distributed Bragg reflector 18 and a portion of cladding region 23 are P-typed doped, with a portion of cladding region 23, active structure 22, and a portion of cladding region 24 being undoped, and with a portion of cladding region 24, and distributed Bragg reflector 26 being N-typed doped.

In the present invention, distributed Bragg reflectors 18 and 26 having alternating layers 19 and 20, 27 and 28 are made of any suitable materials, such as aluminum gallium arsenide (AlGaAs) with the aluminum percentage ranging from 0 to 100% or materials forming a dielectric mirror stack. More specifically, a VCSEL structure designed to emit at 780 nm will include alternating layers 19, 20, 27, and 28 of $Al_{0.25}Ga_{0.75}As/Al_{0.95}Ga_{0.05}As$ or $Al_{0.25}Ga_{0.75}As/AlAs$. A VCSEL structure designed to emit at 850 nm will include alternating layers 19, 20, 27 and 28 of $Al_{0.15}Ga_{0.85}As/Al_{0.85}Ga_{0.15}As$. Irrespective of the material system utilized, layers 19 and 20 are epitaxially disposed or deposited on or overlaying etch stop layer 16 and layers 27 and 28 are epitaxially disposed or deposited on or overlaying cladding region 24, thereby generating distributed Bragg reflectors 18 and 26. It should be understood that while AlGaAs/AlAs DBR structures are utilized in the preferred embodiment, alternative DBR structures utilizing materials such as indium aluminum gallium phosphide and aluminum arsenide (e.g., $In_{0.49}Al_xGa_{0.51-x}P/AlAs$), and indium aluminum gallium phosphide and indium aluminum phosphide (e.g., $In_{0.49}Al_xGa_{0.51-x}P/In_{0.49}Al_{0.5}P$) are anticipated by this disclosure. Additionally, it should be understood that in each of the above examples and throughout this disclosure where a percent composition of a particular element is given it should be considered only as an example. It should be further understood that variations from these examples can be large and are to be considered part of the present invention.

Mirror stack 18 and 26 are formed by depositing pairs of alternating layers using some convenient technique such as molecular beam epitaxy (MBE) or sputtering. In order to crystal lattice match mirror stack 18 to substrate 12 a suitable semiconductor material system must be deposited. Approximately 20–40 mirror pairs of this material system are deposited on etch stop layer 16 depending on the difference between the refractive indices of the layers. As will be explained presently, doping the mirror stacks is not necessary since electrical contacts to the active region can be made laterally.

For the sake of simplicity and to prevent overcrowding of the figure, cladding region 23 is shown as a single layer; however, it should be understood that cladding region 23 is made of at least two components that are epitaxially disposed or deposited on distributed Bragg reflector 18. First, a layer of any suitable material such as aluminum gallium arsenide (AlGaAs) having an appropriate thickness and being doped similarly to distributed Bragg reflector 18 is epitaxially deposited on distributed Bragg reflector 18.

By way of example, an n-doped aluminum gallium arsenide layer ($Al_{0.60}Ga_{0.40}As$) is epitaxially deposited on distributed Bragg reflector 18. Generally, the AlGaAs layer has a thickness that is determined by the wavelength of light that is to be emitted from the VCSEL structure, thereby allowing the thickness of the AlGaAs layer to be any suitable thickness. Second, a layer of any suitable material having an appropriate thickness is epitaxially deposited on the first layer of the cladding region 23.

For the sake of simplicity, active structure 22 is represented by a single layer which is epitaxially deposited or disposed on cladding region 23; however, it should be understood that the active structure 22 can include multiple layers of barrier regions with quantum well regions interspersed. By way of a simple example, active structure 22 is made of at least two barrier layers and a quantum well region with the quantum well region being positioned between the two barrier regions. In a preferred embodiment, active structure 22 is made of four barrier regions and three quantum well regions with the quantum well region being positioned between the two barrier regions. In a VCSEL structure that emits at 780 nm, the quantum well region(s) is made of undoped aluminum gallium arsenide ($Al_{0.12}Ga_{0.88}As$) and the barrier regions are made of aluminum gallium arsenide ($Al_{0.30}Ga_{0.70}As$). In a VCSEL structure that emits at 850 nm, the quantum well region(s) is made of undoped gallium arsenide (GaAs) and the barrier regions are made of aluminum gallium arsenide ($Al_{0.30}Ga_{0.70}As$). Typically, active structure 22 includes three to five quantum wells with their corresponding barrier regions. One skilled in the art will understand that more or fewer quantum well layers and barrier layers can be used depending upon the application. Active region 21 and first and second mirror stacks 18 and 26 respectively are configured to emit light with a wavelength of approximately 780 nm or 850 nm.

For the sake of simplicity and to prevent overcrowding of the figure, cladding region 24 is shown as a single layer; however, it should be understood that cladding region 24 is made of two components that are disposed or deposited epitaxially on active structure 22. First, a layer of any suitable undoped cladding material is epitaxially deposited to an appropriate thickness on active structure 22. Second, a layer of any suitable doped cladding material is epitaxially deposed on the undoped cladding material.

By way of example, an undoped aluminum gallium arsenide ($Al_{0.60}Ga_{0.40}As$) layer is epitaxially deposited on active structure 22. Generally, the undoped AlGaAs has a thickness that is determined by the wavelength of light that is to be emitted from the VCSEL device, thereby allowing the thickness of the AlGaAs layer to be any suitable thickness. Subsequently, a doped layer is epitaxially deposited on the undoped layer. The doped layer is generally doped with a n-type dopant.

A heat dissipation layer 30 is formed by disposing layers of any suitable material on distributed Bragg reflector 26, such as nickel (Ni), gold germanium (AuGe), gold (Au), chromium (Cr), zinc gold (ZnAu), titanium tungsten (TiW), titanium gold (TiAu), or the like. It should be understood that depending upon which material selection is made the specific method of disposing and patterning of that specific material will change to form heat dissipation layer 30. In addition, material selection is dependent upon the doping of top DBR 26 of wafer structure 10. For example, when top DBR 26 is n-type doped, heat dissipation layer 30 includes layers of nickel (Ni), gold germanium (AuGe), and gold (Au). When top DBR 26 is p-type doped, heat dissipation layer 30 includes layers of chromium (Cr), zinc gold (ZnAu), and gold (Au), or titanium tungsten (TiW) and gold (Au), or titanium gold (TiAu) and gold (Au). With the inclusion of an alloy, heat dissipation layer 30 further serves as an electrical contact for the completed VCSEL device.

Figure 2:
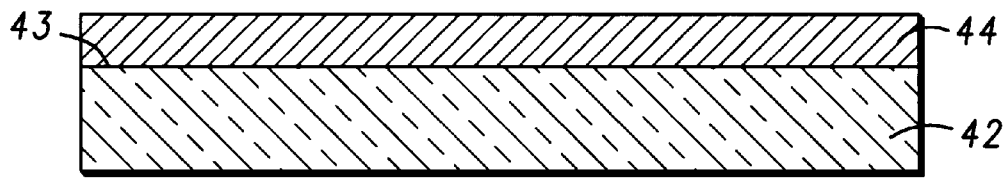
FIG. 2 is a sectional view of a second VCSEL wafer structure in accordance with the present invention.

Referring now to FIG. 2, a second wafer structure 40 is fabricated as a part of the VCSEL device of the present invention. Second wafer structure 40 includes a substrate 42. Substrate 42 in this example is made of any suitable material, such as silicon (Si), silicon carbide (SiC), or the like. Next, a heat dissipation layer 44 is epitaxially deposited on an upper surface 43 of substrate 42. Heat dissipation layer 44 is formed by disposing any suitable material on substrate 42, such as gold (Au), or the like. It should be understood that depending upon which material selection is made the specific method of disposing and patterning of that specific material will change to form heat dissipation layer 44.

Figure 3:
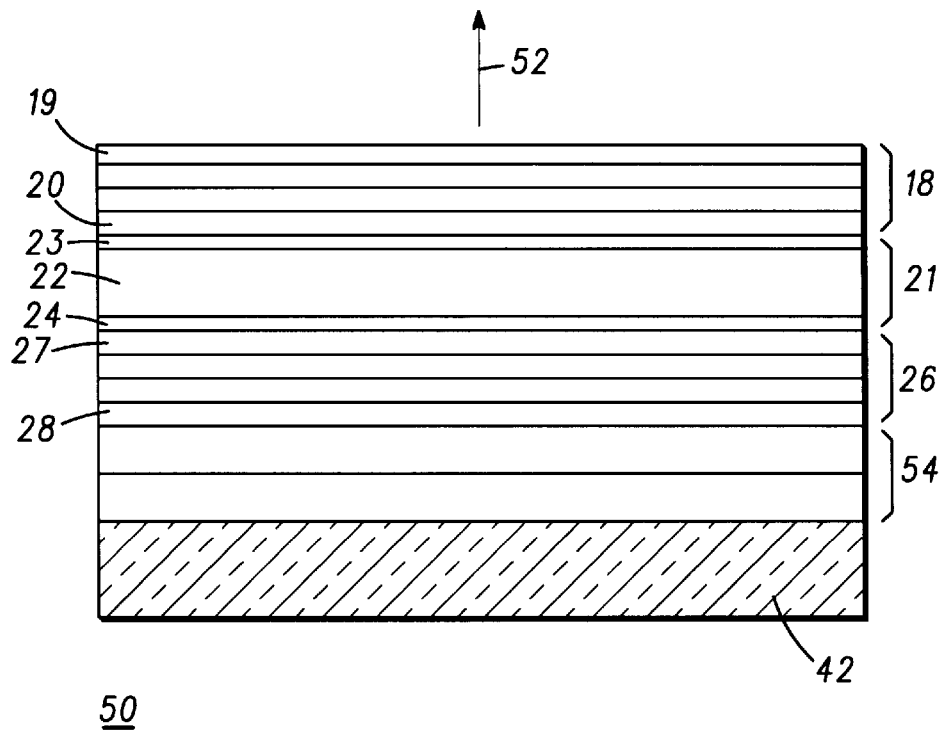
FIG. 3 is a complete VCSEL structure in accordance with the present invention.

Referring now to FIG. 3, illustrated in simplified sectional view is a complete VCSEL device according to the present invention. Illustrated is VCSEL 50 fabricated according to the disclosed method of the present invention. During fabrication, wafer structure 10 of FIG. 1 is metal to metal wafer fused with wafer structure 40 of FIG. 2. More particularly, wafer structure 10 is flip mounted onto wafer structure 40 to allow for the fusing of heat dissipation layer 30 of FIG. 1 and heat dissipation layer 44 of FIG. 2. Once fused, the two separately formed heat dissipation layers become one heat dissipation layer 54 positioned adjacent substrate 42.

Next, the gallium arsenide substrate 12 is removed by chemical etching. Buffer layer 14 and etch stop layer 16 are also removed during this process. Accordingly, a standard VCSEL epi structure is left remaining that includes heat dissipation layer 54 for high power operation.

Figure 4:
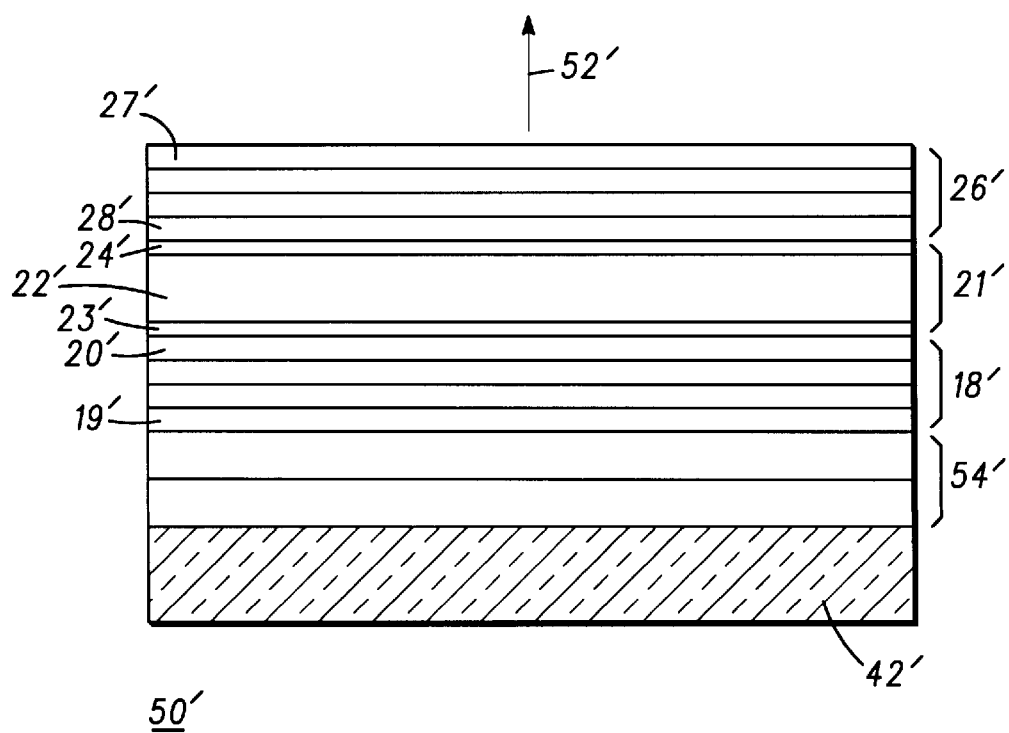
FIG. 4 is a sectional view of a complete VCSEL structure in accordance with the present invention.

To complete VCSEL 50, an electrical contact (not shown) is coupled to a surface of active region 21. A second electrical contact (not shown) is coupled to heat dissipation layer 54. Light 52 is emitted from VCSEL 50 in a direction opposite substrate 42. Various changes and modifications to the embodiments herein chosen for purposes of illustration will readily occur to those skilled in the art. For example, it should be understood that VCSEL structure symmetry exists for both the p and n dopants as well as electrically inverted structure designs as illustrated in FIG. 4. It should be noted that in FIG. 4 all components similar to the components illustrated in FIG. 3, are designated with similar numbers, having a prime added to indicate the different embodiment. To the extent that such modifications and variations do not depart from the spirit of the invention, they are intended to be included within the scope thereof which is assessed only by a fair interpretation of the following claims.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser comprising:
    a first substrate having a surface and including a silicon material;
    a heat dissipation layer adjacent the surface of the first substrate;
    a first mirror stack disposed on the heat dissipation layer;
    an active region disposed on the first mirror stack;
    a second mirror stack disposed on the active region; and
    an initially present second substrate, selectively removed, adjacent the second mirror stack, the first mirror stack, the active region and the second mirror stack generating an emission along a path in a direction away from the surface of the first substrate.

2. A vertical cavity surface emitting laser as claimed in claim 1 wherein the laser is configured for high power operation of greater than 20 milliwatts.

3. A vertical cavity surface emitting laser as claimed in claim 1 wherein the active region and the first and the second mirror stacks are configured to emit light with a wavelength of approximately 780 nm.

4. A vertical cavity surface emitting laser as claimed in claim 1 wherein the active region and the first and the second mirror stacks are configured to emit light with a wavelength of approximately 850 nm.

5. A vertical cavity surface emitting laser as claimed in claim 1 wherein the substrate is a silicon (Si) material.

6. A vertical cavity surface emitting laser as claimed in claim 1 wherein the substrate is a silicon carbide (SiC) material.

7. A vertical cavity surface emitting laser as claimed in claim 1 wherein the heat dissipation layer includes two separate heat dissipation layers, fused together during the fabrication process of the vertical cavity surface emitting laser, thereby forming a single heat dissipation layer.

8. A vertical cavity surface emitting laser as claimed in claim 7 wherein the heat dissipation layer includes layers of a nickel(Ni) material, a gold germanium (AuGe) material and a gold (Au) material.

9. A vertical cavity surface emitting laser as claimed in claim 7 wherein the heat dissipation layer includes layers of one of a chromium material, a zinc gold (ZnAu) material and a gold (Au) material, a titanium tungsten (TiW) material and a gold (Au) material and a titanium gold (TiAu) material and a gold (Au) material.

10. A vertical cavity surface emitting laser as claimed in claim 1 wherein the first mirror stack and the second mirror stack each include a plurality of pairs of alternating layers of an $Al_{x1}Ga_{1-x1}As/Al_{x2}Ga_{1-x2}As$ material system.

11. A vertical cavity surface emitting laser as claimed in claim 10 where x1 ranges from 0 to 50% and x2 ranges from 50 to 100%.

12. A vertical cavity surface emitting laser as claimed in claim 1 wherein the first mirror stack includes a plurality of pairs of alternating layers of a $Al_{x1}Ga_{1-x1}As/Al_{x2}Ga_{1-x2}As$ material and the second mirror stack includes a plurality of pairs of alternating layers of a dielectric material.

13. A vertical cavity surface emitting laser as claimed in claim 12 where x1 ranges from 0 to 50% and x2 ranges from 50 to 100%.

14. A vertical cavity surface emitting laser comprising:
    a substrate having a surface;
    a heat dissipation layer disposed on the surface of the substrate;
    a first mirror stack formed adjacent the heat dissipation layer and including a plurality of pairs of alternating layers, the first mirror stack having a surface;
    an active region having a first and a second surface and including an active structure sandwiched between a first cladding region and a second cladding region, the active region being lattice matched to the surface of the first mirror stack;
    a second mirror stack lattice matched to the second surface of the active region and including a plurality of pairs of alternating layers; and
    an initially present second substrate, selectively removed, adjacent the second mirror stack, the first mirror stack, the active region and the second mirror stack generating an emission along a path in a direction away from the surface of the first substrate and defining an optical pathway through which the emission is generated and passes.

15. A vertical cavity surface emitting laser as claimed in claim 14 wherein the laser is configured for high power operation of greater than 20 milliwatts.

16. A vertical cavity surface emitting laser as claimed in claim 15 wherein the active region and the first and the second mirror stacks are configured to emit light with a wavelength of approximately 780 nm.

17. A vertical cavity surface emitting laser as claimed in claim 15 wherein the active region and the first and the second mirror stacks are configured to emit light with a wavelength of approximately 850 nm.

18. A vertical cavity surface emitting laser as claimed in claim 15 wherein the substrate is a silicon (Si) material.

19. A vertical cavity surface emitting laser as claimed in claim 15 wherein the substrate is a silicon carbide (SiC) material.

20. A vertical cavity surface emitting laser as claimed in claim 15 wherein the laser is configured to emit light through an upper surface of the second mirror stack.

21. A vertical cavity surface emitting laser comprising:
    a first wafer structure including an initially present substrate, selectively removed, a first mirror stack disposed on the initially present substrate, an active region disposed on the first mirror stack, a second mirror stack disposed on the active region, and a heat dissipation disposed on the second mirror stack; and
    a second wafer structure including a substrate having a surface and a heat dissipation layer disposed on the substrate, the first wafer structure, flip chip mounted to the second wafer structure and having selectively removed the initially present substrate, the plurality of heat dissipation layers forming a combined heat dissipation layer and including a remaining single substrate adjacent the combined heat dissipation layer, the first mirror stack, the active region and the second mirror stack generating an emission along a path in a direction away from the surface of the remaining single substrate.

* * * * *